US007514969B2

(12) United States Patent
Nakagawa

(10) Patent No.: US 7,514,969 B2
(45) Date of Patent: Apr. 7, 2009

(54) DRIVER CIRCUIT AND METHOD OF CONTROLLING THE SAME

(75) Inventor: Masashi Nakagawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 21 days.

(21) Appl. No.: 11/882,494

(22) Filed: Aug. 2, 2007

(65) Prior Publication Data

US 2008/0061847 A1 Mar. 13, 2008

(30) Foreign Application Priority Data

Sep. 12, 2006 (JP) ............................ 2006-247173

(51) Int. Cl.
*H03B 1/00* (2006.01)

(52) U.S. Cl. ......................... 327/108; 327/89; 327/563; 326/115; 330/252

(58) Field of Classification Search ............ 327/65–67, 327/87, 89, 108–112, 563; 330/252, 253, 330/258, 260; 326/83, 112, 115, 127
See application file for complete search history.

(56) References Cited

U.S. PATENT DOCUMENTS 5,656,952 A * 8/1997 McCall et al. ................ 326/82
6,300,802 B1 * 10/2001 Smetana ..................... 326/126
6,429,700 B1 8/2002 Yang
7,180,333 B2 2/2007 Tseng
7,408,387 B2 * 8/2008 Suenaga ..................... 327/108

FOREIGN PATENT DOCUMENTS

JP 2004-350272 A 12/2004

* cited by examiner

*Primary Examiner*—An T Luu
(74) *Attorney, Agent, or Firm*—Foley & Lardner LLP

(57) ABSTRACT

A conventional driver circuit has difficulty in controlling output voltages such as an output amplitude and a middle voltage in a CML circuit. Furthermore, in another conventional driver circuit, a high level of an output voltage in the CML circuit is dropped from a power supply voltage. To solve these problems, disclosed is a driver circuit including: an amplitude converter which converts the amplitude of a differential output signal and outputs a differential output signal; an amplitude setting unit which sets the amplitude of the differential output signal; and a common voltage setting unit which sets a center potential of the amplitude of the differential output signal.

19 Claims, 4 Drawing Sheets

100
10
VDD
R1
R2
OUTB
OUT
IN
INB
M1
M2
CS1
CS2
CS3
Id
Is
20
VDD
R3
VOD
AMP1
n1
CS4
30
VDD
R4
AMP2
n2
CS5
CS6
CS7
VOS

DRIVER CIRCUIT AND METHOD OF CONTROLLING THE SAME

BACKGROUND OF THE INVENTION

1. Field of the Invention

The present invention relates to a driver circuit, and particularly to a driver circuit having a CML circuit and a current setting circuit.

2. Description of the Related Art

A driver circuit has heretofore been used as an interface circuit for converting signals between different systems. The driver circuit is that for converting the swing amplitude of a differential input signal, and for outputting a differential signal. A conventional driver circuit is described, for example, in Japanese Patent Application Laid-open Publication No. 2004-350272 or in U.S. Pat. No. 6,429,700. FIG. 4 is a diagram showing a driver circuit described in JP-A No. 2004-350272.

A driver circuit described in JP-A No. 2004-350272 includes a current mode logic (hereinafter referred to as CML) circuit 10 having loads R1 and R2, transistors for switch M1 and M2, and a voltage control current source CS1. Furthermore, a level shift circuit 1 for supplying current is connected to the CML circuit 10. In this case, current is generated and supplied to the CML circuit 10 by the level shift circuit 1, and thereby the CML circuit 10 adjusts the amplitudes of output voltages outputted by output terminals of an OUT and an OUTB.

In addition, FIG. 5 is a diagram showing a conventional CML circuit 10 including loads R1 and R2, transistors for switch M1 and M2, and a voltage control current source CS1. In this case, a high level of an output voltage outputted by the CML circuit 10 is dropped at least by R5×Id from a power supply voltage VDD.

However, in the driver circuit described in JP-A No. 2004-350272, no description is given of a method for setting the value of a current supplied by the level shift circuit 1 to the CML circuit 10, and accordingly it is not clear how to determine the swing amplitude specifically. Furthermore, in the driver circuit described in U.S. Pat. No. 6,429,700, a high level of an output voltage outputted by the CML circuit 10 is dropped from a power supply voltage.

As described above, conventional driver circuits have difficulty in controlling an output voltage of a CML circuit.

SUMMARY

A driver circuit according to the present invention includes: an amplitude converter which converts the swing amplitude of a differential input signal and outputs a differential output signal; an amplitude setting unit which sets the swing amplitude of the differential output signal; and a common voltage setting unit which sets a center potential of the swing amplitude of the differential output signal.

According to the driver circuit of the present invention, it is possible to control the swing amplitude of a voltage outputted by a CML circuit, and a common voltage (a middle voltage).

Furthermore, according to the driver circuit of present invention, it is possible to control an output voltage with high precision.

DETAILED DESCRIPTION OF THE PREFERRED EMBODIMENTS

First Embodiment

Figure 1:
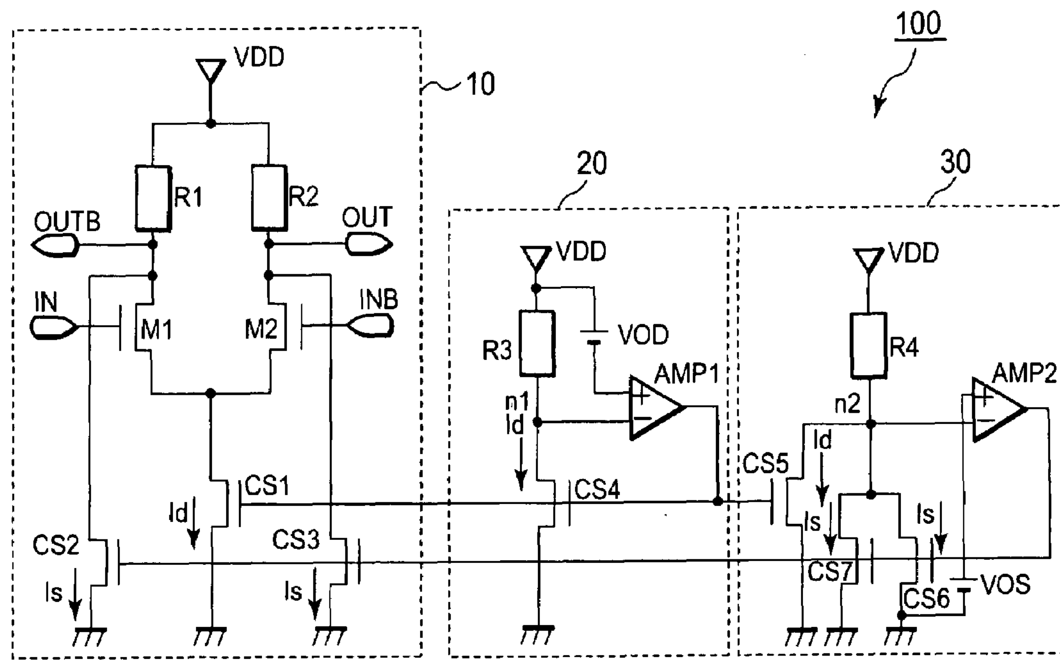
FIG. 1 is a diagram showing a driver circuit 100 according to a first embodiment.

A first embodiment of the present invention is described below with reference to the accompanying drawings. FIG. 1 is a block diagram showing a driver circuit 100 according to a first embodiment of the present invention. As shown in FIG. 1, the driver circuit 100 of the present embodiment includes: an amplitude converter (hereinafter, referred to as a CML circuit 10); an amplitude setting unit (hereinafter, referred to as an amplitude current setting circuit 20); and a common voltage setting unit (hereinafter, referred to as a common current setting circuit 30). Note that detailed configurations for each of the blocks will be described later.

The CML circuit 10 is a circuit which converts a differential signal input to be inputted, and outputs a differential signal to a receiver. The amplitude current setting circuit 20 is a circuit which controls the swing amplitude of a voltage outputted by the driver circuit 10. Furthermore, the common current setting circuit 30 is a circuit which controls a common voltage (a middle voltage) being a midpoint between a maximum value and a minimum value of a voltage outputted by the driver circuit 10.

The CML circuit 10 includes: first and second loads (hereinafter, referred to as resistances R1 and R2); first and second transistors M1 and M2; a power supply voltage terminal VDD; first to third voltage control current sources (hereinafter, referred to as current sources) CS1 to CS3; input terminals IN and INB; and output terminals OUT and OUTB. The first ends of the resistances R1 and R2 are connected to the power supply voltage terminal VDD in common connection. In addition, the second ends of the resistances R1 and R2 are connected to the output terminals OUTB and OUT, respectively. Moreover, the first transistor M1 and the second transistor M2 are connected to a drain of the first current supply CS1 in common connection. Furthermore, the transistor M1 is connected to the output terminal OUTB, and the transistor M2 is connected to the output terminal OUT. Still furthermore, at the gates of the transistors M1 and M2, the input terminals IN and INB are connected, respectively.

A drain of the second current supply CS2 is connected to the output terminal OUTB, and a drain of the third current supply CS3 is connected to the output terminal OUT. Note that in the CML circuit 10 shown in FIG. 1, the second current source CS2 is connected between the output terminal OUTB and the resistance R1, and that the third current source CS3 is connected between the output terminal OUT and the resistance R2. However, this does not cause any problem since the circuit is equivalent to that of the embodiment of the present invention. In addition, the first to third current sources CS1 to CS3 are, respectively, connected to ground potentials.

The amplitude current setting circuit 20 includes: a third load (hereinafter, referred to as a resistance R3); a fourth voltage control current source (hereinafter, referred to as a current source) CS4; a first operational amplifier AMP1; a power supply voltage terminal VDD; and a first voltage generator (hereinafter, referred to as a voltage generator vod). One end of the third resistance R3 is connected to the power supply voltage terminal VDD, and the other end thereof is connected to a drain of the fourth current source CS4. Furthermore, the current source CS4 is connected to a ground potential. To an inverting input terminal of the first operational amplifier AMP1, a node n1 placed between the resistance R3 and the current source CS4 is connected, and to a non-inverting input terminal thereof, the power supply voltage terminal VDD is connected through the voltage generator vod. Still furthermore, the current source CS4 is controlled by the output of the operational amplifier AMP1.

The common current setting circuit 30 includes: a fourth load (hereinafter, referred to as a resistance R4); fifth to seventh voltage control current sources (hereinafter, referred to as current sources) CS5 to CS7; a second operational amplifier AMP2; a power supply voltage terminal VDD; and a second voltage generator (hereinafter, referred to as a voltage generator vos) One end of the fourth resistance R4 is connected to the power supply voltage terminal VDD, and the other end thereof is connected to a drain of the sixth current source CS6 and the seventh current source CS7. Sources of the current sources CS6 and CS7 are connected to ground potentials. Furthermore, to an inverting input terminal of the second operational amplifier AMP2, a node n2 placed between the resistance R4 and the current source CS6 is connected, and a non-inverting input terminal is connected to a ground potential through the voltage generator vos. Still furthermore, the current sources CS6 and CS7 are controlled by an output from an output unit of the operational amplifier AMP2. Moreover, the current source CS5 is connected in between the node n2 which is placed between the resistance R4 and the current source CS6, and the ground potential, and is controlled by an output from an output unit of the operational amplifier AMP1 in the amplitude current setting circuit 20.

In addition, gates of the current sources CS1, CS4 and CS5 are connected to the output unit of the first operational amplifier AMP1 in common connection. On the other hand, gates of the current sources CS2, CS3, CS6 and CS7 are connected to an output unit of the second operational amplifier AMP2 in common connection. In this case, the current sources CS1, CS4 and CS5 are transistors of substantially the same size, and the current sources CS2, CS3, CS6 and CS7 are also transistors of substantially the same size. Operation of the driver circuit 100 of the present embodiment is described in detail below with reference to FIG. 1.

Here, it is assumed as follows: the values of the resistances R1, R2 and R3 are set as R, and the value of the resistance R4 is set as R/2; currents generated in the current sources CS1, CS4 and CS5 are set as Id, and currents generated in the current sources CS2, CS3, CS6 and CS7 are set as Is; and the transistors M1 and M2 have the same characteristics, and are controlled to an ON state or an OFF state according to an input signal at an "H" or "L" level, which is inputted by the input terminals IN and INB.

A description is given of the case where the transistor M1 is in an ON state, and the transistor M2 is in an OFF state. In this case, although a voltage drop (Id×R) occurs in the resistance R1 due to the current source CS1, no voltage drop occurs in the resistance R2 due to the current source CS1. Note that, voltage drops (Is×R) occur in each of the transistors M1 and M2 due to the current sources CS2 and CS3. Accordingly, regardless of the current Is generated in the current sources CS2 and CS3, an "H" level (a maximum value of an output amplitude) is outputted from the output terminal OUT, and an "L" level (a minimum value of an output amplitude) is outputted from the output terminal OUTB. Consequently, when assuming the swing amplitude of a voltage to be outputted as Va, it can be confirmed that Va (a maximum value of an outputted amplitude—a minimum value of an outputted amplitude) corresponds to a voltage drop (Id×R).

Here, the current source CS1 is controlled by the amplitude current setting circuit 20. In the amplitude current setting circuit 20, voltages inputted to the non-inverting input terminal and the inverting input terminal are imaginary short-circuited in the operational amplifier AMP1. Furthermore, since a voltage drop which occurs in the resistance R3 is R×Id, the following equation is obtained: the power supply voltage VDD−the voltage generator vod=the power supply voltage VDD−(R×Id). In other words, the voltage generator vod=R×Id. Here, since the amount of currents flowing in the current sources CS4 and CS1 are equal to each other, a current flowing in the current source CS1 also becomes Id. More specifically, the current Id in the current source CS1 changes in accordance with change of the voltage generator vod in the amplitude current setting circuit 20. Then, the swing amplitude Va of a voltage outputted by the output terminals OUT and OUTB changes in accordance with change of the current Id in the current source CS1. For example, when the voltage vod set in the voltage generator in the amplitude current setting circuit is increased, and thereby, with this increase, the current Id flowing in the current source CS1 is increased, it is possible to increase the swing amplitude Va of an output voltage outputted by the CML circuit 10. Accordingly, the changing of the voltage vod inside the amplitude current setting circuit 20 makes it possible to change the output swing amplitude Va of a signal outputted by the CML circuit 10. In addition, the voltage generator vod in the amplitude current setting circuit is capable of easily generating an accurate value by using a band gap generator.

To be more specific, firstly, the resistance R3 in the amplitude current setting circuit, and the resistances R1 and R2 in the CML circuit are set so as to have the equal resistance values. Secondly, in the amplitude current setting circuit 20, the voltage vod set in the voltage generator is configured such that the voltage vod is equal to the voltage drop R×Id which occurs in the resistance R3. This makes it possible to make the voltage vod set in a voltage setting circuit=Va (a voltage amplitude of a signal outputted by the CML circuit 10). Consequently, an output amplitude of the CML circuit Va=vod (a voltage set in the voltage generator).

As described above, in the case where the transistor M1 is in an ON state, and the transistor M2 is in an OFF state, although the voltage vod set in the amplitude current setting circuit 20 is set to the swing amplitude Va of an output voltage outputted by the CML circuit 10, it is possible to set, as needed, a center potential (common level) of the swing amplitude Va of an output voltage of the CML circuit 10 according to the current Is set in the current sources CS2 and CS3. Note that the common level of the swing amplitude Va of an output voltage of the CML circuit 10 is expressed as follows: (an output level of the output terminal OUT+an output level of the output terminal OUTB)/2. More specifically, allowing the currents Is set in the current sources CS2 and CS3 to be varied makes it possible to control the magnitude of the common level of the swing amplitude Va of an output voltage outputted by the CML circuit 10. Incidentally, a method of generating currents Is set in the current sources CS2 and CS3 is described later in detail.

As described above, as for the swing amplitude Va of voltages outputted to the output terminals OUT and OUTB, by providing the voltage generator vod in the amplitude current setting circuit, and by allowing the currents Id flowing in the current sources CS1 and CS4 to be changed, it is possible to control the magnitude of the swing amplitude Va of an output voltage outputted by the CML circuit 10. Furthermore, by allowing the currents Is flowing in the current sources CS2 and CS3 to be varied, it is possible to control the common level of the swing amplitude Va of an output voltage outputted by the CML circuit 10.

In addition, in the case where the transistor M1 is in an OFF state, and the transistor M2 is in an ON state, a voltage drop (Id×R) occurs in the resistance R2 due to the current source CS1, but no voltage drop occurs in the resistance R1. Accordingly, the "L" level (a minimum value of the amplitude of an output voltage) is outputted from the output terminal OUT, and the "H" level (a maximum value of the amplitude of an output voltage) is outputted from the output terminal OUTB. However, detailed description will be omitted on the case where the swing amplitude Va (a maximum value of the amplitude of an output voltage−a minimum value of the amplitude of an output voltage) of a voltage is controlled by changing the voltage vod in the amplitude current setting circuit 20, since it is the same as the case where the transistor M1 is in an ON state and the transistor M2 is in an OFF state. Even in this case, it is possible to set, as needed, a center potential (common level) of the swing amplitude Va of an output voltage of the CML circuit 10 according to the currents Is set in the current sources CS2 and CS3. In other words, by allowing the currents Is set in the current sources CS2 and CS3 to be changed, it is possible to control the magnitude of the common level of the swing amplitude Va of an output voltage outputted by the CML circuit.

Next, description will be given of the case where the transistors M1 and M2 are in an ON state. In this case, since the resistances R1 and R2 are connected in parallel, currents flowing in the resistances R1 and R2 are equal. Accordingly, the output levels of the output terminals OUT and OUTB become equal. At this time, each of the currents flowing in the resistance R1 or R2 is (Id+2Is)/2, so that the output level Vb of the output terminal OUT or OUTB is power supply voltage VDD−R (Id+2Is)/2.

Here, the current sources CS2 and CS3 are controlled by the common current setting circuit 30. In the common current setting circuit 30, voltages inputted to the non-inverting input terminal and to the inverting input terminal is imaginary short-circuited. Furthermore, since the resistance value of the resistance R4 is R/2, a voltage drop which occurs in the resistance R4 is (Id+2Is) R/2. Accordingly, the following equation is obtained: the voltage generator vos=power supply voltage VDD−R (Id+2Is)/2. Furthermore, each of second currents (hereinafter, referred to as current Is) flowing in the current sources CS6 and CS7 are supplied to the current sources CS2 and CS3, respectively, in the amount of the current Is. More specifically, since the currents flowing in the current sources CS2 and CS3 as well as the current sources CS6 and CS7 become equal, currents flowing in the CS2 and CS3 also become Is. In other words, the current flowing in the current source CS2 or CS3 varies according to the change of the voltage generator vos in the common current setting circuit 30. The output levels Vb of the output terminals OUT and OUTB of the CML circuit 10 change according to the change of the current Is flowing in the current source CS2 or CS3. For example, the currents Is flowing in the current sources CS2 and CS3 are decreased by increasing the voltage generator vos in the common current setting circuit 30, so that the voltage Vb outputted by the CML circuit 10 can be increased. In other words, by allowing the voltage vos in the common current setting circuit 30 to be varied, it becomes possible to change the common voltage Vb of a signal outputted by the CML circuit 10. Note that, the voltage vos in the common current setting circuit 30 is capable of easily generating an accurate value by using the band gap generator.

More specifically, in the driver circuit of the present embodiment, the resistance R4 in the common current setting circuit 30 is set to the half of each resistance value of the resistances R1 and R2 in the CML circuit. Furthermore, the common current setting circuit 30 is configured such that the voltage vos set in the common current setting circuit 30 becomes equal to power supply voltage VDD−R (Id+2Is)/2. This makes it possible to obtain the voltage vos set in the common current setting circuit=Vb (a common voltage outputted by the CML circuit 10). Consequently, the following equation is obtained: the common voltage Vb outputted by the CML circuit 10 vos (a voltage set by the voltage generator).

In addition, as described above, when setting the common voltage to be outputted by the CML circuit 10 in the common current setting circuit 30, the voltage vos set in the common current setting circuit 30 is kept constant, and the currents Is flowing in the current sources CS2 and CS3 are changed, so that it is possible to allow the common voltage Vb outputted by the CML circuit 10 to take a value at a certain level without depending on the power supply voltage VDD.

As described above, as for the common voltages Vb of voltages outputted to the output terminals OUT and OUTB, the voltage generator vos is provided in the common current setting circuit, and the currents Is flowing in the current sources CS2 and CS3 are changed, so that it is possible to control the common voltage Vb.

As described above, the current sources CS1, CS2 and CS3 provided in the CML circuit 10 are controlled by the amplitude current setting circuit 20 and the common current setting circuit 30, so that it is possible to control the swing amplitude Va of a voltage outputted by the CML circuit 10, and the common voltage Vb.

Figure 2:
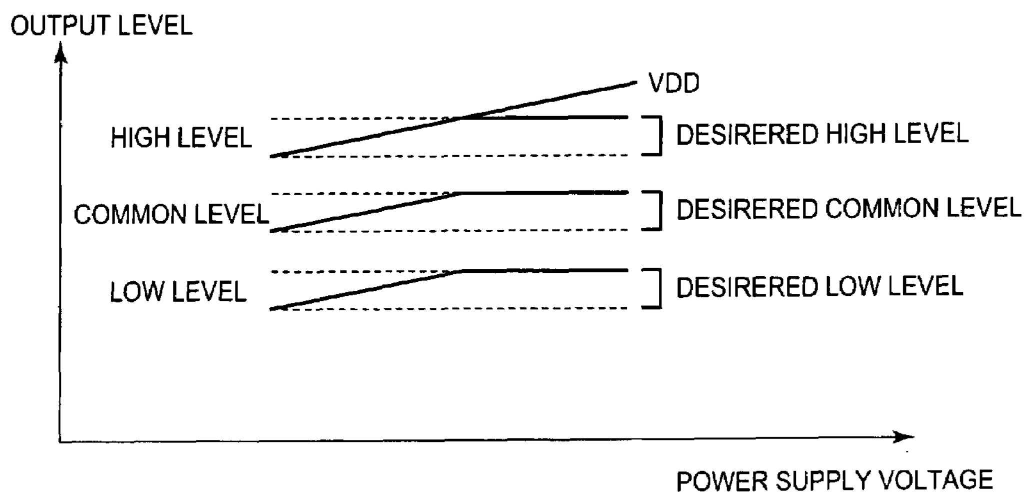
FIG. 2 is a graph showing variation of an output level based on a power supply voltage of the driver circuit 100 according to the first embodiment.
Figure 5:
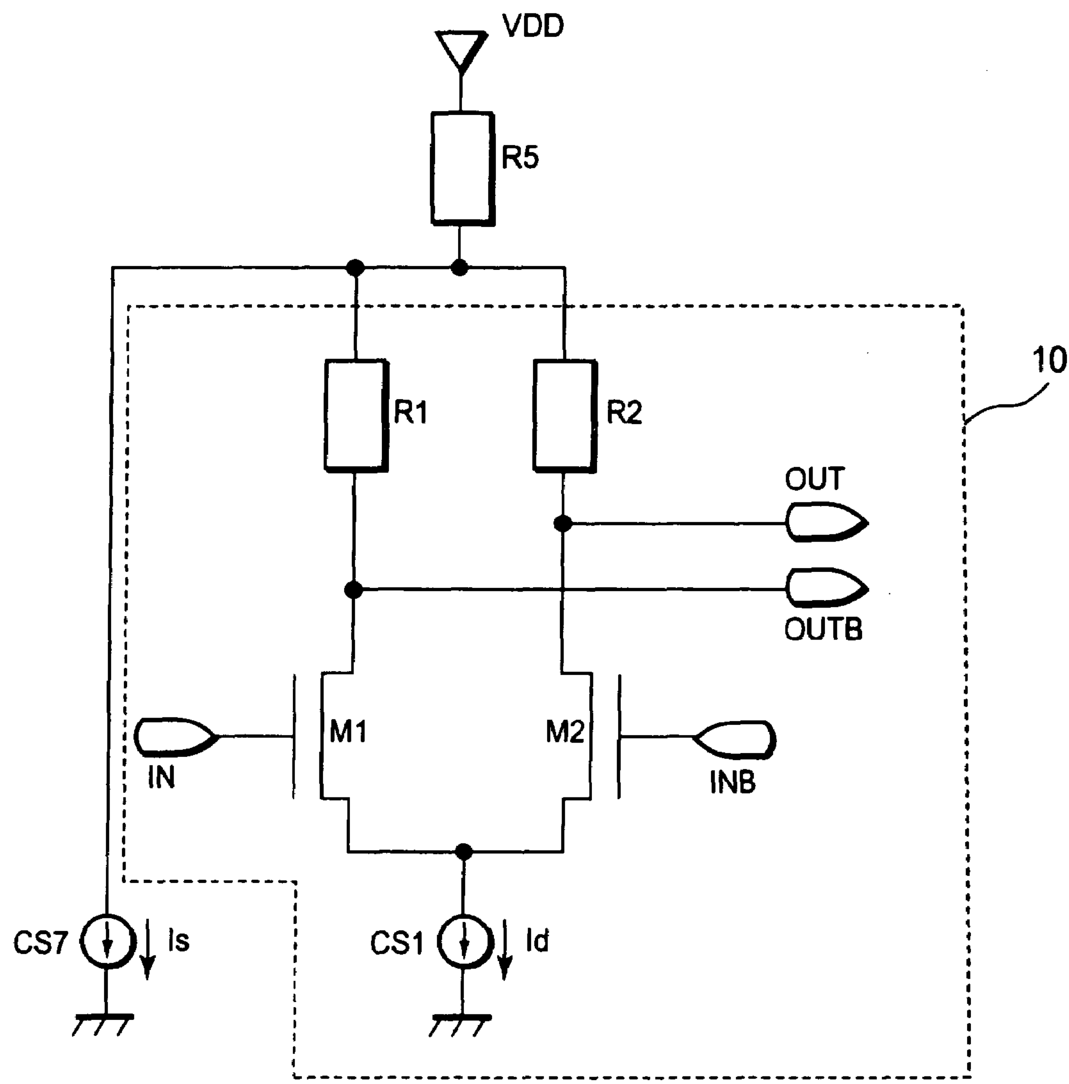
FIG. 5 is a diagram showing a conventional driver circuit.
Figure 6:
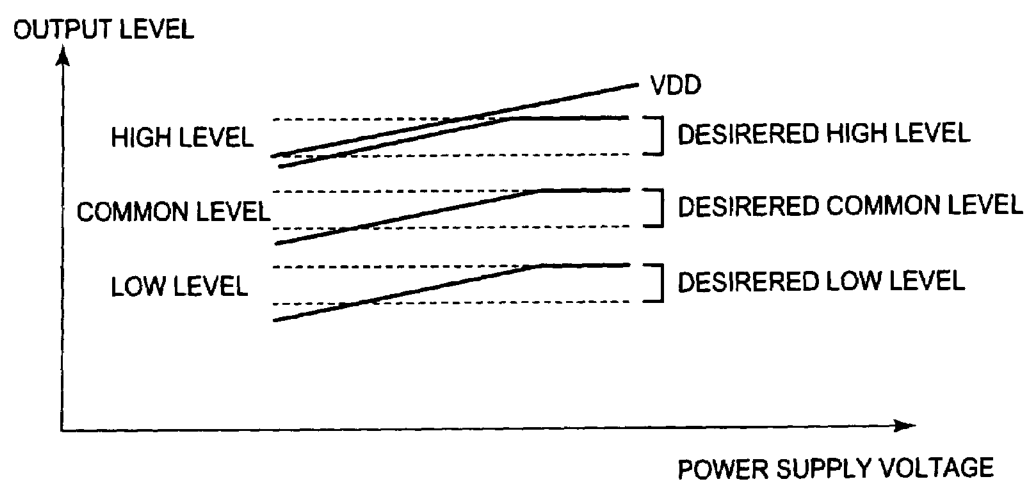
FIG. 6 is a graph showing variation of an output level based on a power supply voltage of the conventional driver circuit.

In addition, a diagram showing the values of output levels to the power source voltage VDD of the CML circuit 10 indicated in the driver circuit 100 of the present embodiment will be shown in FIG. 2. In the driver circuit 100 of the present embodiment shown in FIG. 1, a resistance is eliminated, which corresponds to the resistance R5 shown in a conventional technology (refer to FIG. 5). Accordingly, a high level of a driver output in the conventional technology is dropped from the power supply voltage at least by R5×Id; however, no voltage drop occurs in the resistance R5 in the driver circuit of the present embodiment. Accordingly, it is possible to secure a desired output level by using a power supply voltage which is lower than that used in the conventional technology.

Second Embodiment

Figure 3:
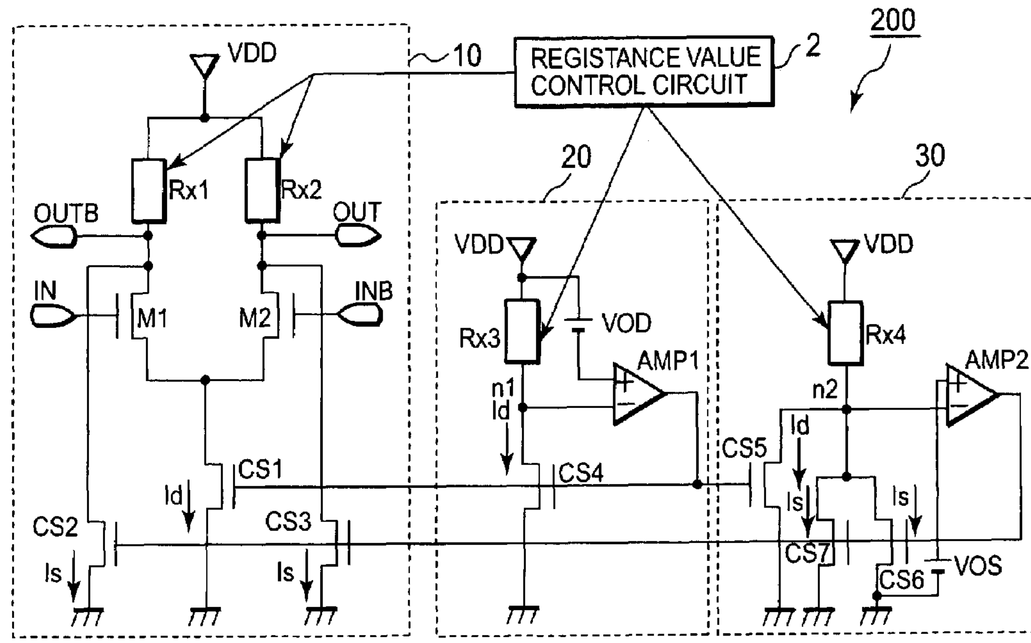
FIG. 3 is a diagram showing a driver circuit 200 according to a second embodiment.
Figure 4:
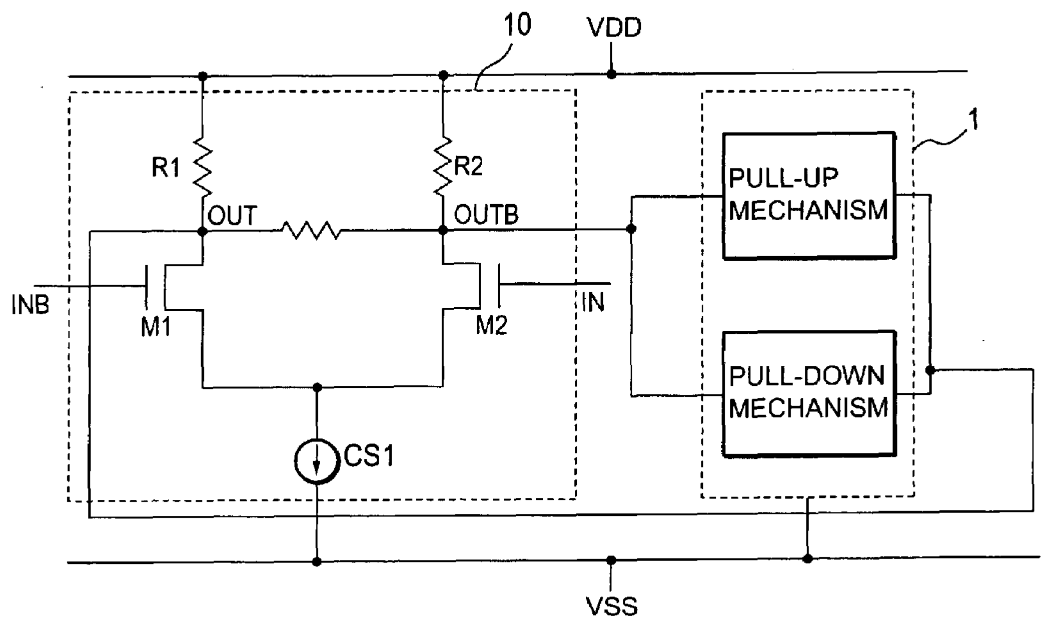
FIG. 4 is a diagram showing a conventional driver circuit.

FIG. 3 is a diagram showing a driver circuit of a second embodiment of the present invention. Note that in FIG. 3, as for the configuration which is common to FIG. 1, the identical elements are denoted by the identical reference numerals, and the detailed descriptions thereof are omitted herein. In a driver circuit shown in FIG. 3, a resistance value control circuit 2 is added to the configuration shown in FIG. 1.

In the resistance value control circuit 2, it is possible to change, as needed, resistance values of resistances R×1 and R×2 of the CML circuit 10, the resistance R×4 of the amplitude current setting circuit 20, and the resistance R×5 of the common current setting circuit 30. In this case, each of the resistances R×1 to R×5 are configured of MOS transistors, and the resistance values are changed by changing voltages which are applied to gates.

As described above, an output impedance of the CML circuit 10, and impedances in the amplitude current setting circuit 20 and the common current setting circuit 30 are simultaneously controlled, so that an output impedance of a driver circuit 100 and a characteristic impedance of an output load can be matched.

As described above, in the present embodiment, the current sources CS1, CS2 and CS3 provided in the CML circuit 10 are controlled by the amplitude current setting circuit 20 and the common current setting circuit 30, so that the voltage swing amplitude Va outputted by the CML circuit 10, and the common voltage (a middle voltage) Vb can be controlled. Furthermore, the output impedance of a driver, and the impedances in the amplitude current setting circuit 20 and the common current setting circuit 30 are simultaneously controlled, so that an output impedance of the driver and a characteristic impedance of an output load can be matched.

Although preferred embodiments of the present invention have been described in detail, the present invention is not limited to the aforementioned embodiments, and various modifications can be made without departing from the aforementioned spirit of the invention.

What is claimed is:

1. A driver circuit comprising:

an amplitude converter generating an output signal having a swing amplitude and a common voltage;

an amplitude setting unit coupled to the amplitude converter to prescribe a first current for establishing the swing amplitude in the amplitude converter; and a common voltage setting unit coupled from the amplitude setting unit and coupled to the amplitude converter to prescribe a second current for establishing the common voltage together with the first current in the amplitude converter.

2. A driver circuit according to claim 1, wherein the amplitude converter comprises a first output terminal outputting the output signal, a first current supply coupled to a first node, the first current supply being operable to source the first current from the first node, and a second current supply coupled to the first output terminal being coupled to the first node, the second current supply being operable to source the second current from the first output terminal.

3. The driver circuit according to claim 2, wherein the amplitude setting unit is responsive to a first predetermined potential to generate a first biasing signal.

4. The driver circuit according to claim 3, wherein the first current supply is responsive to the first biasing signal to generate the first current.

5. The driver circuit according to claim 4, wherein the common voltage setting unit is responsive to a second predetermined potential and the first biasing signal to generate a second biasing signal.

6. The driver circuit according to claim 5, wherein the second current supply is responsive to the second biasing signal to generate the second current.

7. A driver circuit comprising:

an amplitude setting unit generating a first biasing signal in response to a first predetermined potential;

a mutual node receiving the first biasing signal;

a common voltage setting unit generating a second biasing signal in response to both of a second predetermined potential and the first biasing signal via the mutual node; and an amplitude converter generating a first output signal having a first swing amplitude corresponding to the first biasing signal via the mutual node, and a first common voltage corresponding to the second biasing signal.

8. The driver circuit according to claim 7, wherein the amplitude converter comprises:

a first node;

a first input terminal receiving a first input signal, a first output terminal outputting the first output signal, a first transistor having a control electrode coupled from the first input terminal, a first current conducting electrode coupled to the first output terminal, and a second current conducting electrode coupled to the first node, a first resistance having a first electrode coupled to a first voltage and a second electrode coupled to the first output terminal, a second transistor having a control electrode receiving the first biasing signal via the mutual node, a first current conducting electrode coupled to the first node, and a second current conducting electrode coupled to a second voltage to establish the first swing amplitude in the amplitude converter, a third transistor having a control electrode receiving the second biasing signal, a first current conducting electrode coupled to the first output terminal, and a second current conducting electrode coupled to the second voltage to establish the first common voltage in the amplitude converter.

9. The driver circuit according to claim 8, wherein the amplitude setting unit comprises:

a second node;

a second resistance having a first electrode coupled to the first voltage and a second electrode coupled to the second node, a fourth transistor having a control electrode receiving the first biasing signal, a first current conducting electrode coupled to the second node, and a second current conducting electrode coupled to the second voltage; and a first operational amplifier including a first input receiving the first predetermined potential, a second input receiving a voltage corresponding the second node, and an output outputting the first biasing signal corresponding to a difference between the first predetermined potential and the voltage.

10. The driver circuit according to claim 9, wherein the common voltage setting unit comprises:

a third node;

a third resistance having a first electrode coupled to the first voltage and a second electrode coupled to the third node, a fifth transistor having a control electrode receiving the first biasing signal, a first current conducting electrode coupled to the third node, and a second current conducting electrode coupled to the second voltage;

a sixth transistor having a control electrode receiving the second biasing signal, a first current conducting electrode coupled to the third node, and a second current conducting electrode coupled to the second voltage; and a second operational amplifier including a first input receiving the second predetermined potential, a second input receiving a voltage corresponding the third node, and an output outputting the second biasing signal corresponding to a difference between the second predetermined potential and the voltage.

11. The driver circuit according to claim 10, wherein an amplitude converter generating a second output signal having a second swing amplitude corresponding to the first biasing signal via the mutual node, and a second common voltage corresponding to the second biasing signal.

12. The driver circuit according to claim 11, wherein the amplitude converter comprises:

a second input terminal receiving a second input signal, a second output terminal outputting the second output signal, a seventh transistor having a control electrode coupled from the second input terminal, a first current conducting electrode coupled to the second output terminal, and a second current conducting electrode coupled to the first node, a fourth resistance having a first electrode coupled to the first voltage and a second electrode coupled to the second output terminal, a eighth transistor having a control electrode receiving the second biasing signal, a first current conducting electrode coupled to the second output terminal, and a second current conducting electrode coupled to the second voltage to establish the second common voltage in the amplitude converter.

13. The driver circuit according to claim 12, wherein the common voltage setting unit comprises a nineth transistor having a control electrode receiving the second biasing signal, a first current conducting electrode coupled to the third node, and a second current conducting electrode coupled to the second voltage.

14. The driver circuit according to claim 13, comprising:

a resistance value control circuit performing an impedance matching operation of an output impedance of the first output terminal by controlling simultaneously the first, second, and third resistances.

15. The driver circuit according to claim 14, wherein the resistance value control circuit performing an impedance matching operation of an output impedance of the second output terminal by controlling simultaneously the fourth, second, and third resistances.

16. A semiconductor circuit comprising a signal circuit having a output node, a first node and a second node and producing at the output node a signal that has a swing amplitude and a common voltage, the swing amplitude being controlled by a first potential at the first node, the common voltage being controlled by a second potential at the second node, the first potential comprising a first voltage, and the second potential comprising the first voltage and a second voltage.

17. The semiconductor circuit according to claim 16, wherein the signal circuit comprises:

a third node;

a input node receiving a input signal, a first transistor having a control electrode coupled from the input node, a first current conducting electrode coupled to the output node, and a second current conducting electrode coupled to the third node, a resistance having a first electrode coupled to a third voltage and a second electrode coupled to the output node, a second transistor having a control electrode coupled to the first node, a first current conducting electrode coupled to the third node, and a second current conducting electrode coupled to a fourth voltage, a third transistor having a control electrode coupled to the second node, a first current conducting electrode coupled to the output node, and a second current conducting electrode coupled to the fourth voltage.

18. The semiconductor circuit according to claim 16, further comprising an amplitude setting unit comprises:

a fourth node;

a second resistance having a first electrode coupled to the third voltage and a second electrode coupled to the fourth node, a fourth transistor having a control electrode receiving the first potential, a first current conducting electrode coupled to the fourth node, and a second current conducting electrode coupled to the fourth voltage; and a first operational amplifier including a first input receiving the first voltage, a second input receiving a voltage corresponding the fourth node, and an output outputting the first potential corresponding to a difference between the voltage and the first voltage.

19. The semiconductor circuit according to claim 17, further comprising a common voltage setting unit comprises:

a fifth node;

a third resistance having a first electrode coupled to the third voltage and a second electrode coupled to the fifth node, a fifth transistor having a control electrode receiving the first potential, a first current conducting electrode coupled to the fifth node, and a second current conducting electrode coupled to the fourth voltage;

a sixth transistor having a control electrode receiving the second potential, a first current conducting electrode coupled to the fifth node, and a second current conducting electrode coupled to the fourth voltage; and a second operational amplifier including a first input receiving the second voltage, a second input receiving a voltage corresponding the fifth node, and an output outputting the second potential corresponding to a difference between the voltage and the second voltage.

* * * * *